(12) United States Patent
Nogami et al.

(10) Patent No.: US 10,930,477 B2
(45) Date of Patent: Feb. 23, 2021

(54) PLASMA PROCESSING APPARATUS

(71) Applicant: TOKYO ELECTRON LIMITED, Tokyo (JP)

(72) Inventors: Takafumi Nogami, Nirasaki (JP); Hiroshi Kaneko, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 94 days.

(21) Appl. No.: 16/214,466

(22) Filed: Dec. 10, 2018

(65) Prior Publication Data

US 2019/0180989 A1 Jun. 13, 2019

(30) Foreign Application Priority Data

Dec. 13, 2017 (JP) .............................. JP2017-239038

(51) Int. Cl.
*H01J 37/32* (2006.01)
*C23C 16/511* (2006.01)

(52) U.S. Cl.
CPC ...... *H01J 37/32807* (2013.01); *C23C 16/511* (2013.01); *H01J 37/3222* (2013.01); *H01J 2237/3321* (2013.01); *H01J 2237/3323* (2013.01)

(58) Field of Classification Search
USPC .............................. 118/723 MW; 156/345.41
See application file for complete search history.

(56) References Cited

U.S. PATENT DOCUMENTS

| | | | | |
|---|---|---|---|---|
| 2007/0221294 A1* | 9/2007 | Sasaki | ............... | H01L 21/02252 148/222 |
| 2009/0301656 A1* | 12/2009 | Nishimoto | ........ | H01J 37/32192 156/345.41 |
| 2011/0121058 A1* | 5/2011 | Nishimoto | ........ | H01J 37/32522 228/121 |
| 2012/0160809 A1* | 6/2012 | Ishibashi | ............... | C23C 16/511 216/69 |
| 2015/0232993 A1* | 8/2015 | Iwao | ................. | C23C 16/45536 118/723 AN |

FOREIGN PATENT DOCUMENTS

| | | |
|---|---|---|
| JP | 10-2005-0078633 A | 7/2015 |
| KR | 10-2010-0054826 A | 5/2010 |
| KR | 10-2011-0010643 A | 2/2011 |
| WO | 2011021607 A | 2/2011 |

* cited by examiner

*Primary Examiner* — Rakesh K Dhingra
(74) *Attorney, Agent, or Firm* — Nath, Goldberg & Meyer; Jerald L. Meyer

(57) ABSTRACT

A plasma processing apparatus for performing a plasma process on a workpiece inside a processing container by radiating microwaves from an antenna into the processing container through a top plate of the processing container to generate plasma, which includes: a pressing member having grooves formed in a surface facing the top plate, and configured to press the antenna against the top plate; and elastic members respectively disposed in the grooves and deformed while being sandwiched between the pressing member and the antenna, and configured to apply a pressing force to the antenna toward the processing container. The grooves and the elastic members are respectively provided in concentric annular regions each having a center coinciding with a predetermined axis perpendicular to the top plate, and the elastic members are disposed only in a portion of the annular regions.

3 Claims, 11 Drawing Sheets

Portion other than region R11

130

Portion of region R11

130

Portion other than region R11

Portion of region R11

PLASMA PROCESSING APPARATUS

CROSS-REFERENCE TO RELATED APPLICATION

This application is based upon and claims the benefit of priority from Japanese Patent Application No. 2017-239038, filed on Dec. 13, 2017, the entire contents of which are incorporated herein by reference.

TECHNICAL FIELD

The present disclosure relates to a plasma processing apparatus for performing plasma processing on a workpiece such as a semiconductor wafer or the like.

BACKGROUND

Conventionally, an apparatus using microwaves is known as a plasma processing apparatus that performs a predetermined plasma process such as a plasma-based CVD (Chemical Vapor Deposition) process or the like on a workpiece such as a semiconductor wafer or the like. The plasma processing apparatus using microwaves includes, for example, a coaxial waveguide disposed along a predetermined axis at the side of a top plate of a processing container, and an antenna in which a slow-wave plate and a slot plate having a plurality of slots formed therein are stacked in the named order from the top. The antenna is disposed on an upper portion of the top plate of the processing container made of a dielectric material. A lower end of the coaxial waveguide is connected to the slot plate. With a plasma generation mechanism having such a configuration, the microwaves generated from a microwave generator propagate radially in a radial direction by the slow-wave plate via the coaxial waveguide. The microwaves are transmitted through the top plate from the slots of the slot plate and are radiated into the processing container to generate an electric field. Thus, plasma is generated.

In this type of plasma processing apparatus, the distribution of the electric field inside the processing container may be biased, which makes the plasma process uneven in the plane.

On the other hand, in a conventional plasma processing apparatus, for example, six stub members capable of extending from the side of an outer conductor of the coaxial waveguide toward the side of an inner conductor thereof are provided at equal intervals along a circumferential direction. In this plasma processing apparatus, a circumferential balance of an electric flux line in the coaxial waveguide is adjusted by changing a distance between each stub member and an outer circumferential surface of the inner conductor, so that plasma is uniformly generated in the circumferential direction inside the processing container, thus ensuring the in-plane uniformity of the plasma process.

However, the use of the stub members of the related art makes it difficult to address the in-plane non-uniformity caused by the plasma process performed by the plasma processing apparatus.

SUMMARY

Some embodiments of the present disclosure provide a plasma processing apparatus capable of performing a plasma process on a workpiece inside a processing container uniformly in the plane of the workpiece.

According to one embodiment of the present disclosure, there is provided a plasma processing apparatus for performing a plasma process on a workpiece inside a processing container by radiating microwaves from an antenna into the processing container through a top plate of the processing container to generate plasma, the apparatus including: a pressing member having a plurality of grooves formed in a surface facing the top plate of the processing container, and configured to press the antenna against the top plate of the processing container; and a plurality of elastic members respectively disposed in the plurality of grooves and deformed while being sandwiched between the pressing member and the antenna, the plurality of elastic members being configured to apply a pressing force to the antenna toward the processing container, wherein the plurality of grooves and the plurality of elastic members are respectively provided in a plurality of concentric annular regions each having a center coinciding with a predetermined axis perpendicular to the top plate so as to have a circular arc shape or an annular shape around the predetermined axis, and the plurality of elastic members are disposed only in a portion of the plurality of annular regions.

According to another embodiment of the present disclosure, there is provided a plasma processing apparatus for performing a plasma process on a workpiece inside a processing container by radiating microwaves from an antenna into the processing container through a top plate of the processing container to generate plasma, the apparatus including: a pressing member having a plurality of grooves formed in a surface facing the top plate of the processing container, and configured to press the antenna against the top plate of the processing container; and a plurality of elastic members respectively disposed in the plurality of grooves and deformed while being sandwiched between the pressing member and the antenna, the plurality of elastic members being configured to apply a pressing force to the antenna toward the processing container, wherein the plurality of grooves and the plurality of elastic members are respectively provided in a plurality of concentric annular regions each having a center coinciding with a predetermined axis perpendicular to the top plate so as to have a circular arc shape or an annular shape around the predetermined axis, and a portion of the plurality of elastic members has at least one attribute that is different from other portion of the plurality of elastic members.

According to another embodiment of the present disclosure, there is provided a plasma processing apparatus for performing a plasma process on a workpiece inside a processing container by radiating microwaves from an antenna into the processing container through a top plate of the processing container to generate plasma, the apparatus including: a pressing member having a plurality of grooves formed in a surface facing the top plate of the processing container, and configured to press the antenna against the top plate of the processing container; and a plurality of elastic members respectively disposed in the plurality of grooves and deformed while being sandwiched between the pressing member and the antenna, the plurality of elastic members being configured to apply a pressing force to the antenna toward the processing container, wherein the plurality of grooves and the plurality of elastic members are respectively provided in a plurality of concentric annular regions each having a center coinciding with a predetermined axis perpendicular to the top plate so as to have a circular arc shape or an annular shape around the predetermined axis, and a portion of the plurality of grooves is different in depth from other portion of the plurality of grooves.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
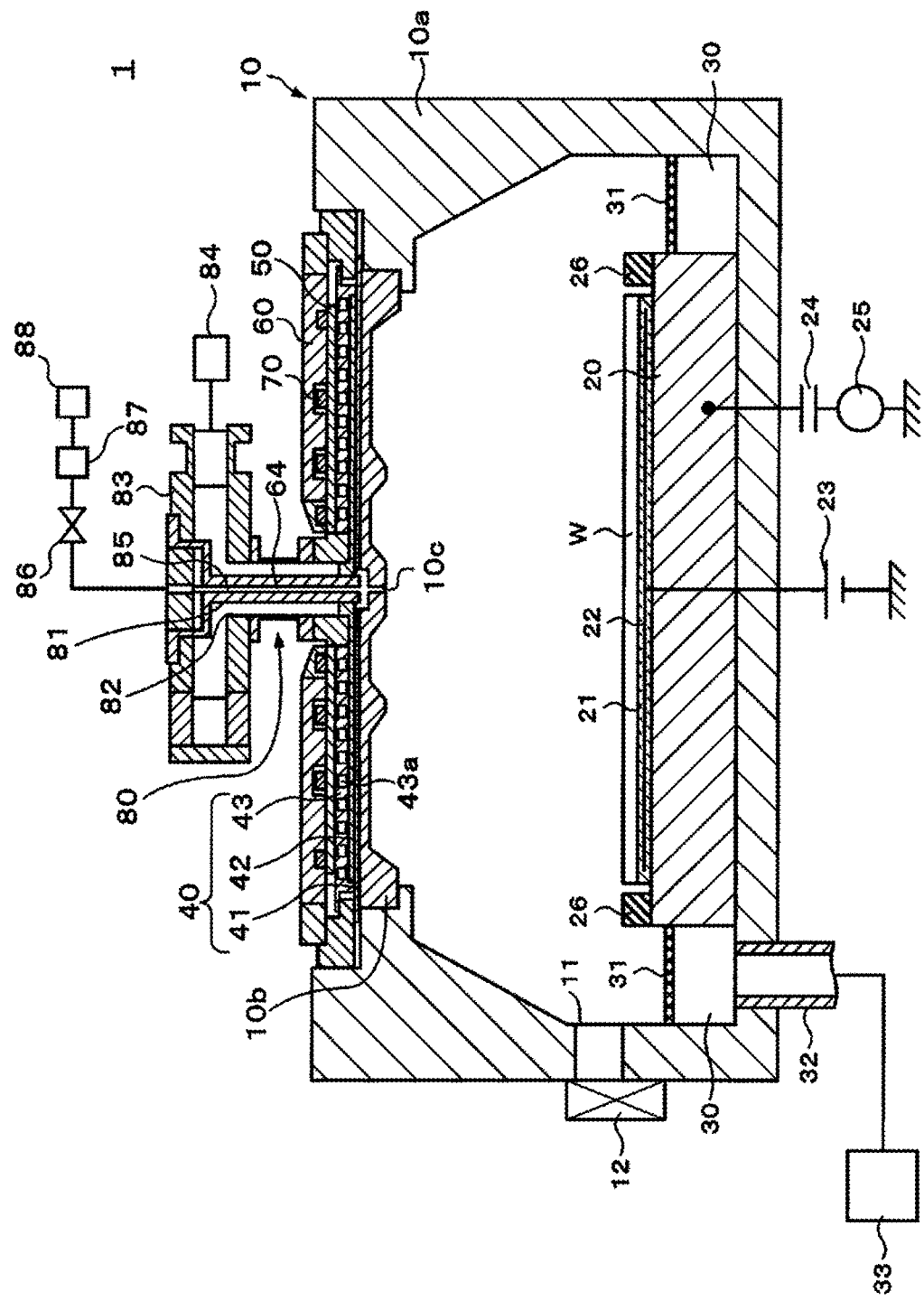
FIG. 1 is a vertical sectional view schematically showing a configuration of a plasma processing apparatus according to a first embodiment of the present disclosure.

Hereinafter, embodiments of the present disclosure will be described with reference to the drawings. In the subject specification and the drawings, elements having substantially the same functional configuration are denoted by like reference numerals, whereby redundant explanations thereof are omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, a case where a plasma processing apparatus is a film-forming apparatus that performs a plasma-based CVD process on a surface (upper surface) of a semiconductor wafer as a workpiece will be described by way of example. However, the present disclosure is applicable to all apparatuses that perform a plasma process on a workpiece using plasma and is not limited to the film forming apparatus that performs the plasma-based CVD process.

First Embodiment

FIG. 1 is a vertical sectional view schematically showing a configuration of a plasma processing apparatus 1 according to a first embodiment of the present disclosure.

As shown in FIG. 1, the plasma processing apparatus 1 includes a processing container 10. The processing container 10 includes a substantially cylindrical container body 10a with its ceiling surface opened, and a top plate 10b that closes the opening and made of a dielectric material. An antenna 40 described later is disposed above the top plate 10b.

A loading/unloading port 11 through which a disk-shaped semiconductor wafer W (hereinafter referred to as a "wafer W") is transferred, is formed in a side surface of the container body 10a. A gate valve 12 is provided at the loading/unloading port 11. The interior of the processing container 10 is hermetically sealed. A metal such as aluminum or stainless steel is used for the container body 10a. The container body 10a is electrically grounded.

The top plate 10b is a dielectric plate formed of a dielectric material such as quartz, $Al_2O_3$, AlN or the like. The top plate 10b transmits microwaves radiated from the antenna 40 therethrough. The top plate 10b is airtightly provided on an upper portion of the container body 10a via a sealing material (not shown) such as, for example, an O ring or the like, so that the interior of the processing container 10 is hermetically sealed. An injection port 10c is formed in the central portion of the top plate 10b.

A cylindrical mounting table 20 for mounting the wafer W thereon is provided on an inner bottom of the processing container 10. For example, AlN or the like is used for the mounting table 20.

An electrostatic chuck 21 is provided on an upper surface of the mounting table 20. The electrostatic chuck 21 has a configuration in which an electrode 22 is sandwiched between insulating materials. The electrode 22 is connected to a DC power supply 23 provided outside the processing container 10. A Coulomb force is generated on the surface of the electrostatic chuck 21 by the DC power supply 23, whereby the wafer W can be electrostatically attracted onto the electrostatic chuck 21, i.e., on the mounting table 20.

In addition, a high-frequency power supply 25 for RF (Radio Frequency) bias may be coupled to the mounting table 20 via a capacitor 24. The high-frequency power supply 25 outputs a predetermined high-frequency power having a constant frequency, for example, 13.56 MHz, which is suitable for controlling the energy of ions to be implanted into the wafer W.

An annular focus ring 26 is provided on the upper surface of the mounting table 20 so as to surround the wafer W mounted on the electrostatic chuck 21. For example, an insulating material such as ceramics or quartz is used for the focus ring 26. The focus ring 26 is used to improve the uniformity of plasma process.

Lift pins (not shown) for raising or lowering the wafer W while supporting the wafer W from below are provided in the mounting table 20. The lift pins are inserted into through-holes (not shown) formed in the mounting table 20 and can protrude from the upper surface of the mounting table 20.

An annular exhaust space 30 is formed around the mounting table 20 between the mounting table 20 and an inner surface of the processing container 10. An annular baffle plate 31 having a plurality of exhaust holes formed therein is provided above the exhaust space 30 in order to uniformly evacuate the interior of the processing container 10. An exhaust pipe 32 is connected to the bottom of the exhaust space 30 and the bottom of the processing container 10. The number of exhaust pipes 32 may be arbitrarily set. A plurality of exhaust pipes 32 may be arranged in the circumferential direction. The exhaust pipe 32 is connected to, for example, an exhaust device 33 including a vacuum pump. The exhaust device 33 can depressurize an internal atmosphere of the processing container 10 to have a predetermined degree of vacuum.

The antenna 40 for radiating and supplying microwaves for plasma generation is provided above the processing container 10. The antenna 40 includes a slot plate 41, a slow-wave plate 42 and a cooling jacket (also referred to as a cooling plate) 43, which are stacked in the named order from below.

The slot plate 41 is provided on the upper surface of the top plate 10b of the processing container 10 so as to face the mounting table 20. A plurality of slots (not shown) is formed in the slot plate 41. In the slot plate 41, an opening is formed at a position overlapping the injection port 10c of the top plate 10b. A conductive material such as, for example, copper, aluminum, nickel or the like is used for the slot plate 41. The slot plate 41 irradiates the microwaves propagated from a below-described coaxial waveguide 80 onto the top plate 10b via the slots.

The slow-wave plate 42 is formed in a circular shape in a plan view and is provided on an upper surface of the slot plate 41. A low-loss dielectric material such as, for example, quartz, $Al_2O_3$, MN or the like is used for the slow-wave plate 42. The slow-wave plate 42 shortens the wavelength of the microwaves and propagates the microwaves in the radial direction. The slow wave plate 42 has a substantially cylindrical opening through which an inner conductor 81 of the coaxial waveguide 80 (to be described later) passes and which is sandwiched between the inner conductor 81 and an outer tube 82.

The cooling jacket 43 is provided on an upper surface of the slow-wave plate 42 so as to cover the slow-wave plate 42 and the slot plate 41. For example, a plurality of flow paths 43a having an annular shape in a plan view and circulates a cooling medium therethrough is formed inside the cooling jacket 43. A heater 50 is installed on an upper surface of the cooling jacket 43. Temperatures of the top plate 10b of the processing container 10, and the slot plate 41, the slow-wave plate 42 and the cooling jacket 43 of the antenna 40 are adjusted to a predetermined temperature by adjusting a temperature of the cooling medium flowing through the flow paths 43a and adjusting a temperature of the heater 50.

A disk-shaped pressing member 60 for pressing the heater 50 and the antenna 40 against the top plate 10b of the processing container 10 is provided above the heater 50.

For example, stainless steel is used as the material of the pressing member 60. Grooves 62 (see FIG. 2) are formed in a surface facing the top plate 10b in the pressing member 60. Elastic members 70 are respectively arranged in the grooves 62.

Each of the elastic members 70 is composed of, for example, a spiral spring gasket. The elastic members 70 are deformed while being sandwiched between the pressing member 60 and the antenna 40. The elastic members 70 apply a pressing force to the antenna 40 toward the processing container 10 via the heater 50.

By a pressing mechanism composed of the pressing member 60 and the elastic members 70, the antenna 40 is pressed against the top plate 10b of the processing container 10 so that the electric field distribution becomes uniform in a predetermined plane inside the processing container 10.

Details of the pressing member 60 and the elastic member 70 will be described later.

The coaxial waveguide 80 for supplying microwaves and a reaction gas to the antenna 40 is connected to the central portion of the antenna 40. The coaxial waveguide 80 includes the inner conductor 81 having a substantially cylindrical hollow shape and the outer tube 82. The inner conductor 81 passes through the opening of the slow-wave plate 42 and the opening of the slot plate 41.

A waveguide 83 and a microwave generator 84 for generating microwaves are connected to the coaxial waveguide 80 in the named order from the side of the coaxial waveguide 80. The microwave generator 84 generates microwaves of a predetermined frequency, for example, 2.45 GHz.

With this configuration, the microwaves generated by the microwave generator 84 propagate through the waveguide 83 and the coaxial waveguide 80 in that order and are supplied into the antenna 40. The microwaves propagate through the slow-wave plate 42 and are radiated from the slots of the slot plate 41 into the processing container 10 through the top plate 10b. The processing gas can be plasmarized by the microwaves inside the processing container 10. The plasma process of the wafer W can be performed by the plasma.

Further, a space 85 defined inside the inner conductor 81 of the coaxial waveguide 80 is in communication with the injection port 10c of the top plate 10b. Moreover, a reaction gas supply source 88 is coupled to an upper end of the inner conductor 81 via a valve 86 and a flow rate control part 87 such as a mass flow controller or the like. Gas supplied from the supply source 88 is supplied into the processing container 10 via the space 85 defined inside the inner conductor 81 of the coaxial waveguide 80 and the injection port 10c of the top plate 10b. A raw material gas for film formation, a gas for plasma excitation such as an Ar gas or the like, and a purge gas are individually stored in the supply source 88.

In the plasma processing apparatus 1 configured as above, the antenna 40 is pressed against the top plate 10b of the processing container 10 by the elastic members 70 which are deformed while being sandwiched between the pressing member 60 having the grooves 62 and the antenna 40. In this example, by adjusting the disposition positions of the elastic members 70, it is possible to uniformly perform the plasma process on the wafer W in the plane of the wafer W. Hereinafter, the elastic members 70 and the grooves 62 in which the elastic members 70 are disposed will be described with reference to FIGS. 2 and 3.

Figure 2:
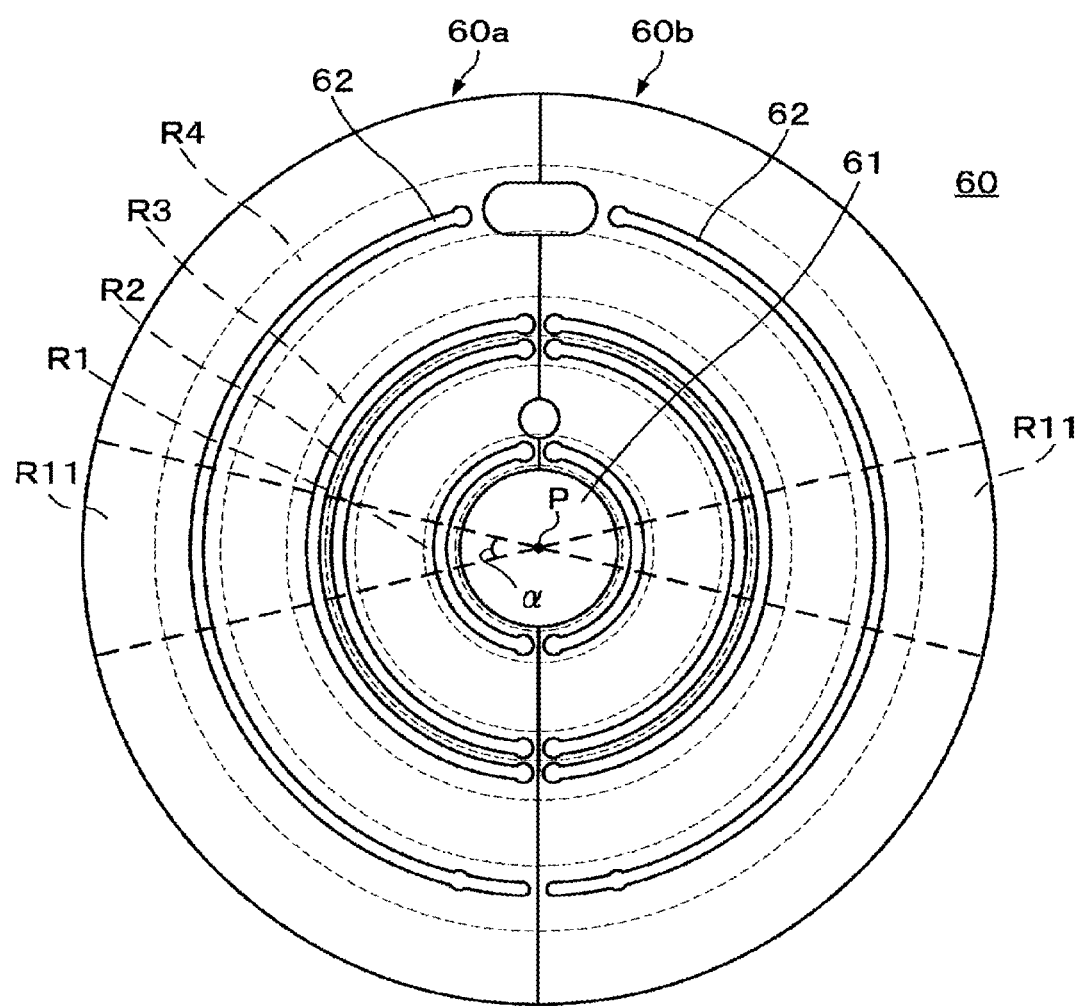
FIG. 2 is a bottom view of a pressing member shown in FIG. 1.
Figure 3:
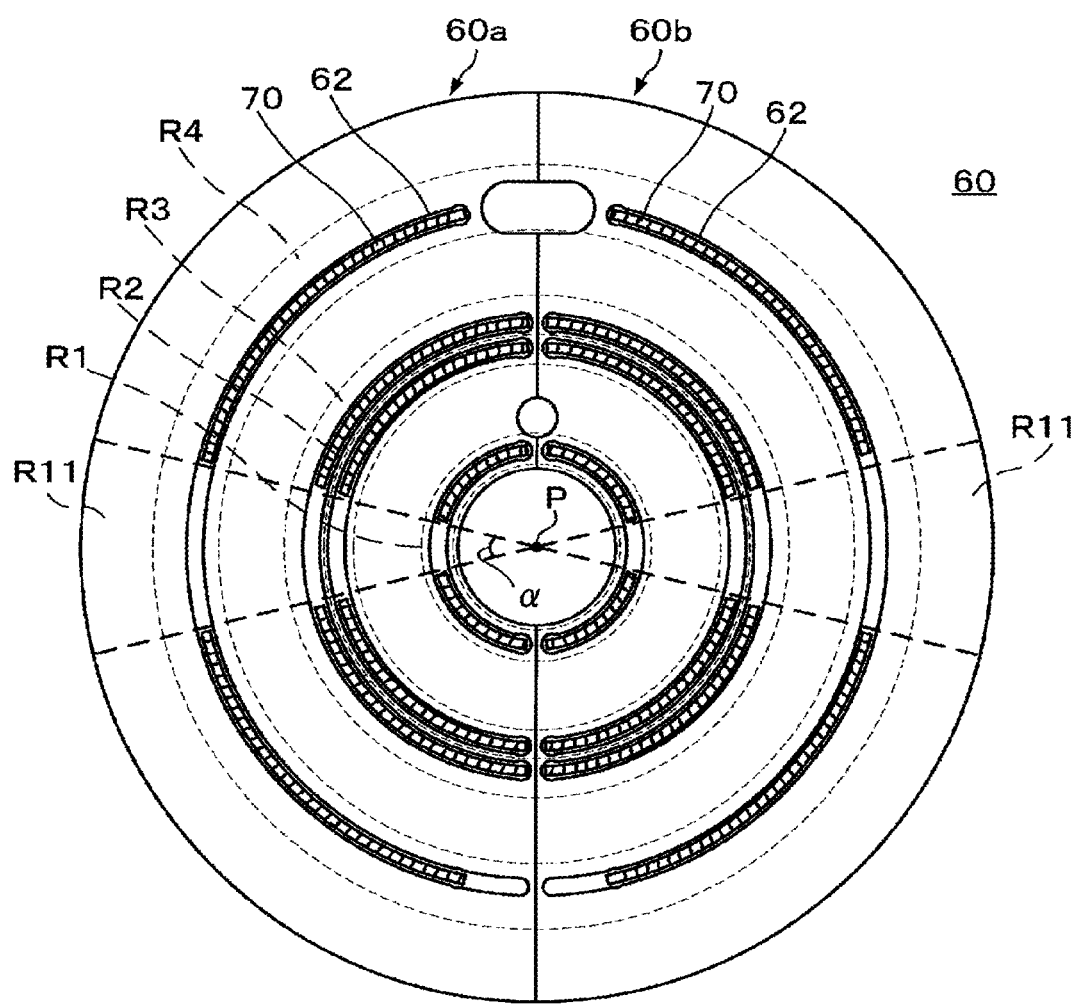
FIG. 3 is a bottom view of the pressing member on which an elastic member is provided.

FIG. 2 is a bottom view of the pressing member 60 having the grooves 62 formed therein. FIG. 3 is a bottom view of the pressing member 60 in which the elastic members 70 are respectively disposed in the grooves 62.

As shown in FIG. 2, the pressing member 60 of this example is divided into two semicircular members in a plan view, i.e., two semicircular plate members 60a and 60b, so that the pressing member 60 can be arranged in a state in which the coaxial waveguide 80 (see FIG. 1) on which a structure thicker than the coaxial waveguide 80 is disposed is arranged on the antenna 40. In the following description, a direction in which a boundary line between the semicircular plate member 60*a* and the semicircular plate member 60*b* extends when the pressing member 60 is incorporated in the plasma processing apparatus 1 will be referred to as a division direction of the pressing member 60.

In the semicircular plate members 60*a* and 60*b*, cutouts which constitute the opening through which the coaxial waveguide 80 passes are formed at the center of portions facing each other.

In the semicircular plate members 60*a* and 60*b*, semi-annular grooves 62 having a center coinciding with a center axis P in a bottom view are respectively formed in a plurality of concentric annular regions R1 to R4 each having a center coinciding with the center axis P as a predetermined axis perpendicular to the top plate 10*b*. The grooves 62 have a semicircular shape in a sectional view. The grooves 62 are formed with a uniform depth along the circumferential direction, and the depth is the same between the grooves 62.

Meanwhile, the elastic members 70 are respectively disposed only in a portion in the plurality of annular regions R1 to R4. Specifically, each of the elastic members 70 is disposed only in a portion of each of the plurality of annular regions R1 to R4. More specifically, the elastic members 70 are respectively disposed in the annular regions R1 to R4 only in portions except for fan-shaped regions R11 including the center of semicircle formed by each of the semicircular plate members 60*a* and 60*b* and the apex of the semicircle. For example, the fan-shaped regions R11 form a sector having an angle α of 36 to 72 degrees and having a center coinciding with the center axis P. Attributes of the elastic members 70, such as the diameter in a sectional view and the like, are uniform along the circumferential direction and are the same between the elastic members 70. The attributes of the elastic members 70 include, for example, the material of the elastic members 70 and the number of turns of a spiral spring constituting each of the elastic members 70, in addition to the diameter in the sectional view described above.

Figure 4:
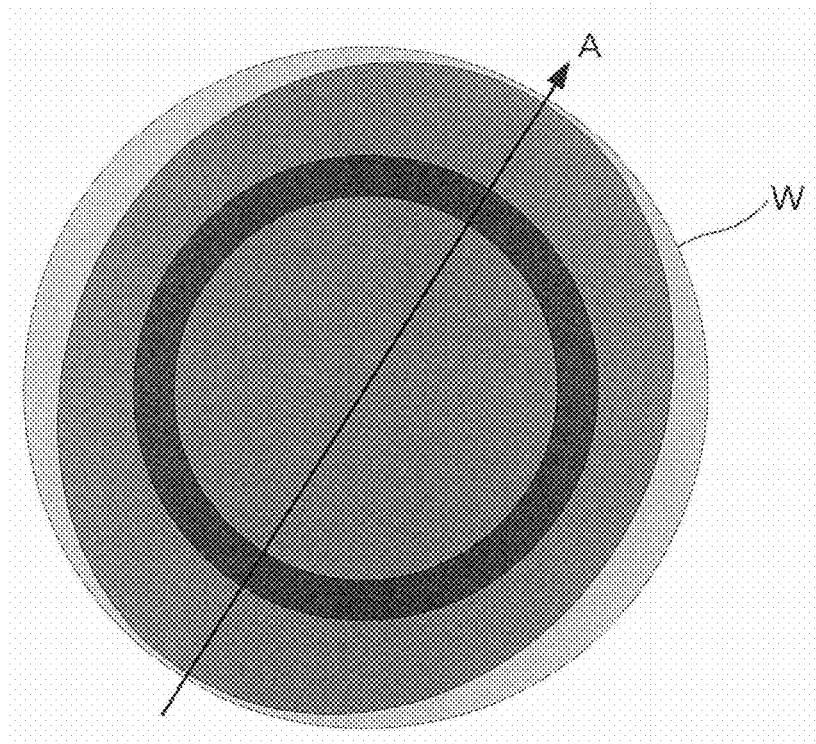
FIG. 4 is a diagram showing a wafer in-plane film thickness distribution of a film formed on a wafer by a plasma processing apparatus for comparison.
Figure 5:
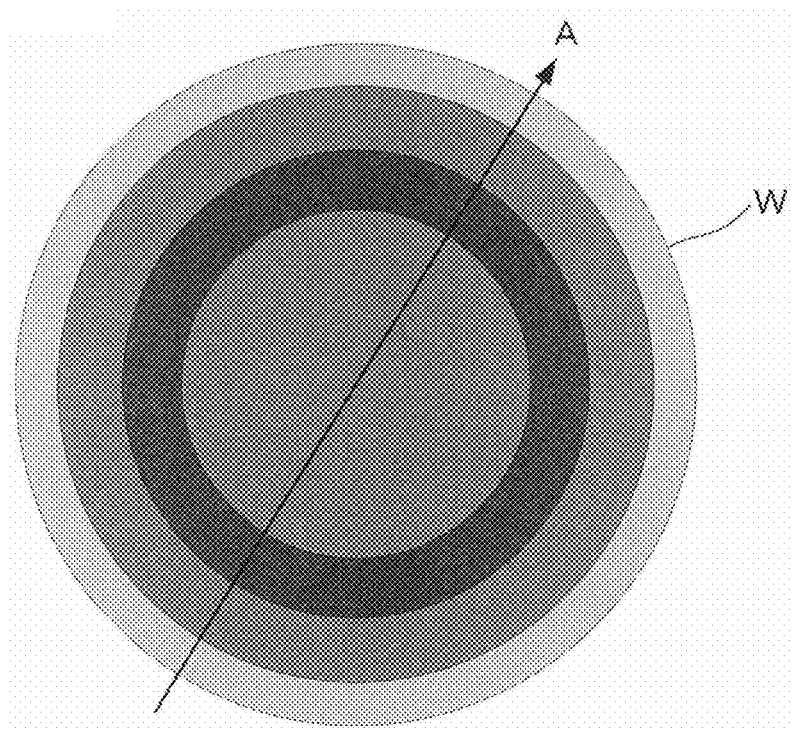
FIG. 5 is a diagram showing a wafer in-plane film thickness distribution of a film formed on a wafer by the plasma processing apparatus shown in FIG. 1.

FIG. 4 is a diagram schematically showing a wafer in-plane film thickness distribution of a film formed on a wafer W by a plasma processing apparatus (hereinafter referred to as a plasma processing apparatus for comparison) in which the elastic members 70 are disposed in the entire annular regions R1 to R4, i.e., in the entire grooves 62, unlike the plasma processing apparatus 1. FIG. 5 is a diagram schematically showing a wafer in-plane film thickness distribution of the film formed on the wafer W by the plasma processing apparatus 1. In FIGS. 4 and 5, the magnitude of the film thickness is indicated by gradations. The light color indicates that the film thickness is large, and the dark color indicates that the film thickness is small.

When processing is performed by a plasma processing apparatus in which the pressing member 60 is divided into two members at the center thereof as in the plasma processing apparatus for comparison, as shown in FIG. 4, the film thickness at both ends of the pressing member 60 in the division direction A becomes large. This is because the antenna 40 is not pressed against the top plate 10*b* of the processing container 10 at the boundary portion between the semicircular plate member 60*a* and the semicircular plate member 60*b* of the pressing member 60, whereby the intensity of the plasma generated inside the processing container 10 is not uniform on the surface of the wafer W but is large at both ends of the pressing member 60 in the division direction A and the plasma distribution is distorted on the surface of the wafer W. Plasma distortion generated when plasma processing is performed by the plasma processing apparatus for comparison is such elliptical distortion that when plasma intensity is represented by contour lines, plasma distortion has an elliptical shape whose major axis direction is the division direction A of the pressing member 60. Such elliptical distortion of plasma cannot be solved by the method using stub members as described in the Background section of the present disclosure.

On the other hand, in the plasma processing apparatus 1, the elastic members 70 are not disposed in the fan-shaped regions R11 located above portions where the intensity of plasma tends to decrease due to the structure in which the pressing member 60 is divided into two members at the center thereof. The elastic members 70 are disposed only in the portions other than the fan-shaped regions R11. As a result, the pressing force of the elastic members 70 is weakened in the fan-shaped regions R11, i.e., regions including both ends of the pressing member 60 in the direction orthogonal to the division direction A. Therefore, the intensity of the plasma inside the processing container 10 can be made uniform on the surface of the wafer W, which makes it possible to perform the plasma process on the wafer W uniformly in the plane of the wafer W. Accordingly, when the plasma process is performed by the plasma processing apparatus 1, as shown in FIG. 5, the thickness of the formed film becomes uniform at the peripheral portion of the wafer W.

As described above, according to the plasma processing apparatus 1, in the processing container 10, plasma can be uniformly generated on the surface of the wafer W without causing elliptical distortion of plasma which may otherwise be caused due to the structure in which the pressing member 60 is divided into two members at the center thereof. Thus, the plasma process can be performed uniformly in the plane of the wafer W.

The angle α of the sector formed by the fan-shaped region R11 is set, for example, based on the actual plasma processing result so that the plasma process becomes uniform in the plane. When the angle α of the sector formed by the fan-shaped region R11, i.e., the region where the elastic members 70 are not disposed, is smaller than the set angle, the distribution of the plasma generated inside the processing container 10 is distorted into an elliptical shape whose major axis direction is the division direction A of the pressing member 60. When the angle α of the sector is larger than the set angle, the distribution of the plasma is distorted into an elliptical shape whose minor axis direction is the division direction A of the pressing member 60.

When the interior of the processing container 10 is in a vacuum state, the top plate 10*b* is pulled toward the processing space inside the processing container 10 so that the top plate 10*b* is deformed into a downwardly-convex shape. At that time, a gap is formed between the antenna 40 and the top plate 10*b*. The plasma processing apparatus 1 may operate in a mode (hereinafter referred to as a non-resonance mode) in which, as the gap becomes smaller, a transmittance at which the microwaves radiated from the antenna 40 transmit through the top plate 10*b* grows larger, and may operate in a mode (resonance mode) in which microwave resonance occurs in the gap and the transmittance grows larger as the gap becomes larger.

In the plasma processing apparatus 1, as shown in FIGS. 4 and 5, in the region located under the boundary region between the semicircular plate member 60*a* and the semicircular plate member 60*b* or under the fan-shaped regions R11 where the elastic members 70 are not disposed, namely in the region where the gap between the antenna 40 and the top plate 10*b* is large, the film thickness is increased. That is to say, the microwave transmittance is high and the plasma intensity is high. In other words, in the process recipe and the slot plate of this example, the plasma processing apparatus 1 operates in the resonance mode.

Next, an example of a method of manufacturing the plasma processing apparatus 1 will be described.

When manufacturing the plasma processing apparatus 1, first, the pressing member 60 having the grooves 62 formed therein is prepared, provisional elastic members 70 are disposed in predetermined regions inside the grooves 62, and the plasma processing apparatus 1 for adjustment of the disposition conditions of the elastic members 70 is manufactured. Subsequently, by using the plasma processing apparatus 1 for adjustment, a plasma process is performed on the wafer W according to a desired processing recipe, thereby forming a film on the wafer W. Subsequently, based on the state of the formed film, i.e., based on the result of the plasma process, the conditions of the region where the elastic members 70 are disposed are adjusted. Thereafter, the elastic members 70 are disposed based on the adjusted conditions. In this way, the plasma processing apparatus 1 is prepared. The series of processes described above may be performed at a manufacturing factory of a plasma processing apparatus by a manufacturer of the plasma processing apparatus 1 who has acquired information on the desired processing recipe from a user or may be performed by a user at a user's semiconductor manufacturing factory where the plasma processing apparatus 1 is used.

A plurality of through-holes (not shown) is formed along the circumferential direction at the bottom of the portions at which the fan-shaped regions R11 are positioned in the grooves 62. Screws for fixing a holding member (not shown) which holds the elastic members 70 in the grooves 62 are inserted into the plurality of through-holes. By forming the plurality of through-holes along the circumferential direction in this manner, it is possible to hold the elastic members 70 of various lengths in the respective grooves 62.

By manufacturing the plasma processing apparatus 1 as described above, in the plasma processing apparatus 1, it is possible to uniformly generate plasma on the surface of the wafer W inside the processing container 10 without causing elliptical distortion of plasma which may otherwise be caused due to the structure in which the pressing member 60 is divided into two members at the center thereof. Thus, the plasma process can be performed uniformly in the plane of the wafer W.

The generation state of plasma inside the processing container 10 varies depending on the recipe for plasma process and the slot plate 41. In other words, if the recipe for plasma process and the slot plate 41 are the same, the generation state of plasma is the same. Therefore, if the recipe for plasma process and the slot plate 41 are the same, the conditions for disposing the elastic members 70, which have been adjusted using the plasma processing apparatus for adjustment, can be applied to a plurality of plasma processing apparatuses 1.

Second Embodiment

Figure 6:
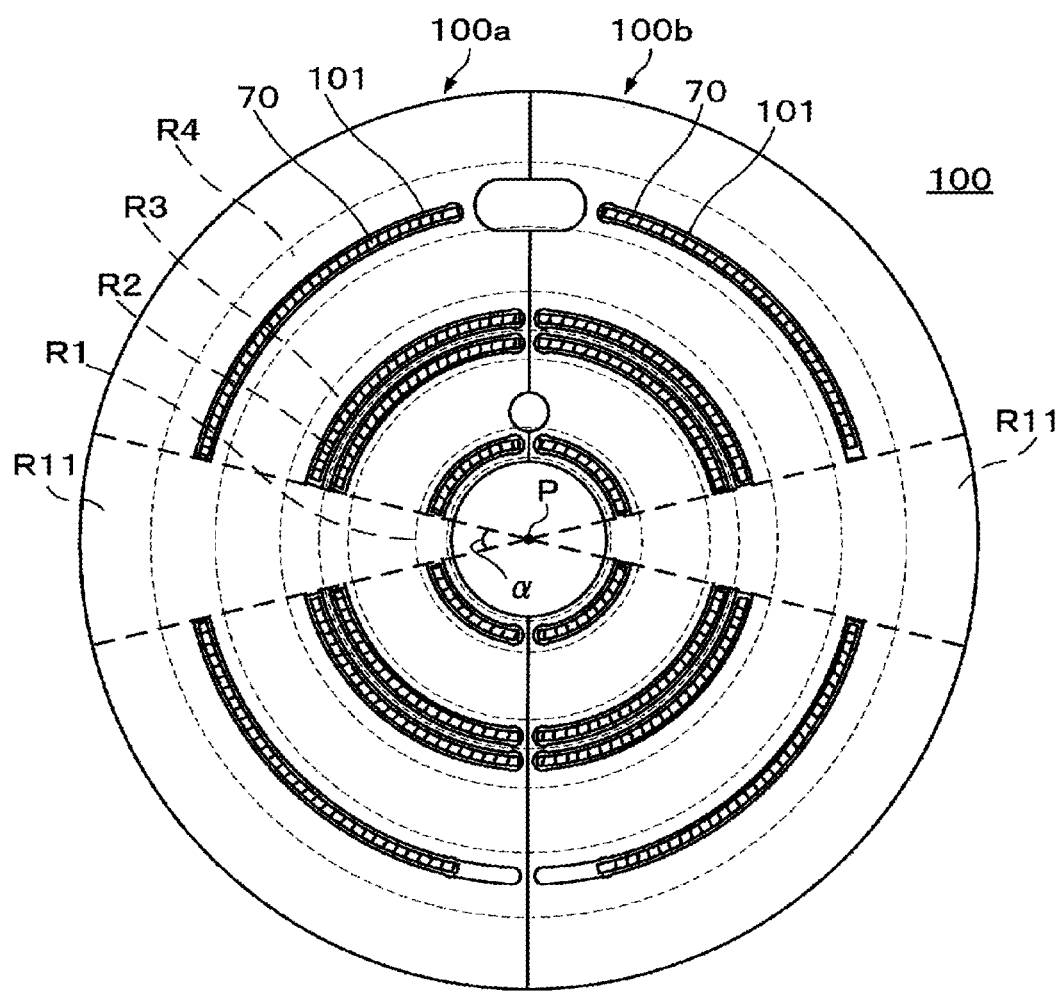
FIG. 6 is a bottom view of a pressing member of a plasma processing apparatus according to a second embodiment of the present disclosure.

FIG. 6 is a bottom view of a pressing member 100 of a plasma processing apparatus according to a second embodiment of the present disclosure. Since configurations other than the pressing member 100 are the same as those of the first embodiment, description thereof will be omitted.

As shown in FIG. 6, the pressing member 100 of the present embodiment is composed of two semicircular plate members 100a and 100b just like the pressing member 60 shown in FIG. 2. In the pressing member 60 shown in FIG. 2, the grooves 62 are formed in the entire annular regions R1 to R4 including the fan-shaped regions R11 and have a semicircular arc shape in a plan view. On the other hand, in the pressing member 100 of the present embodiment, the grooves 101 are formed only in the portions of the annular regions R1 to R4 except for the fan-shaped regions R11.

Even in the plasma processing apparatus 1 including the pressing member 100, it is possible to uniformly generate plasma on the surface of the wafer W without causing elliptical distortion of plasma which may otherwise be caused due to the structure in which the pressing member 100 is divided into two members at the center thereof. Thus, the plasma processing can be performed uniformly in the plane of the wafer W.

When manufacturing the plasma processing apparatus 1 of the present embodiment, a pressing member 60 having provisional grooves 101 formed in a predetermined region is prepared, provisional elastic members 70 are disposed in the respective provisional grooves 101, and a plasma processing apparatus 1 for adjusting the formation conditions of the grooves 101 and the disposition conditions of the elastic members 70 is manufactured. Then, based on the result of the plasma process performed by the plasma processing apparatus 1 for adjustment, the formation conditions of the grooves 101 and the disposition conditions of the elastic members 70 are adjusted.

Third Embodiment

Figure 7:
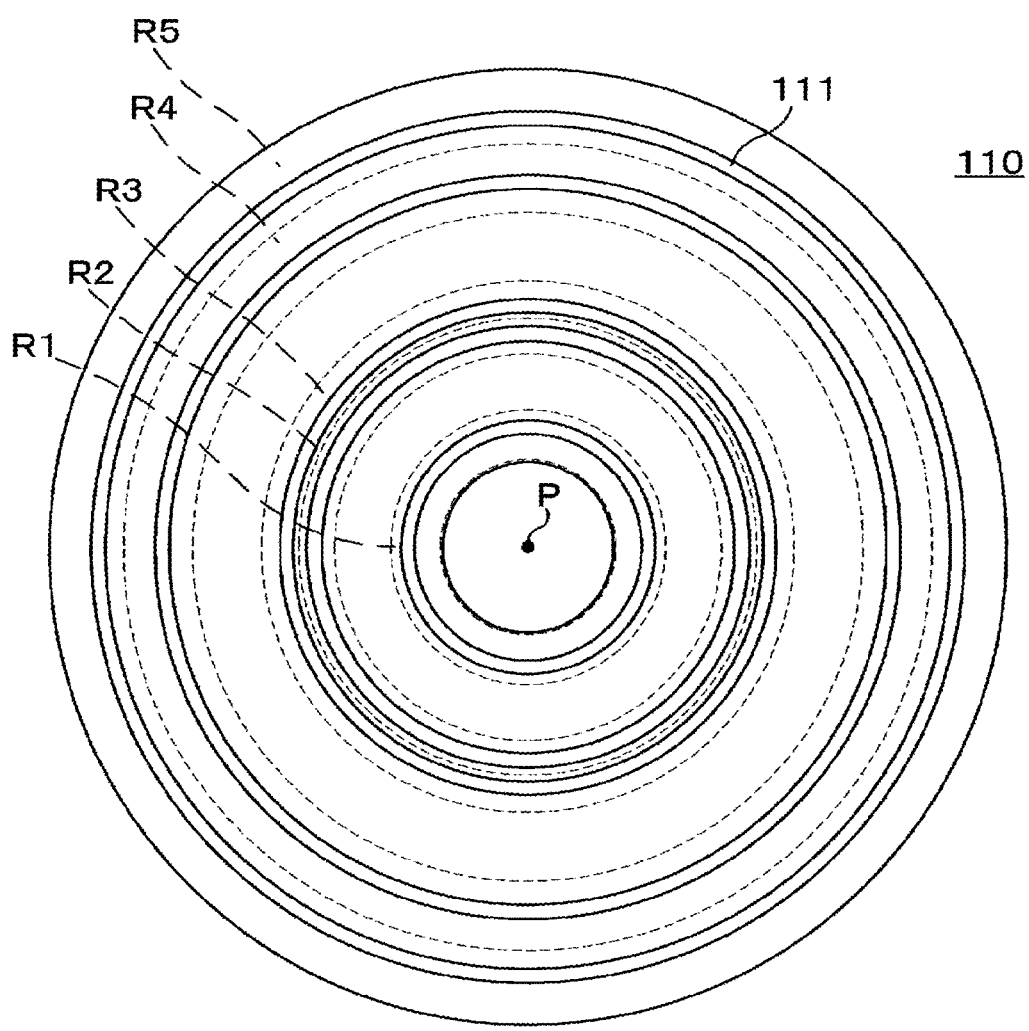
FIG. 7 is a bottom view of a pressing member of a plasma processing apparatus according to a third embodiment of the present disclosure.
Figure 8:
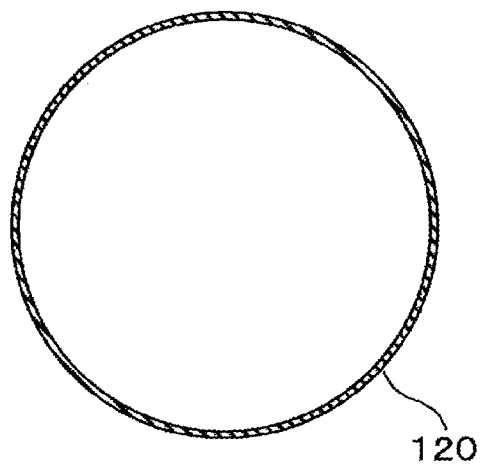
FIG. 8 is a plan view of an elastic member disposed with respect to the pressing member shown in FIG. 7.
Figure 9:
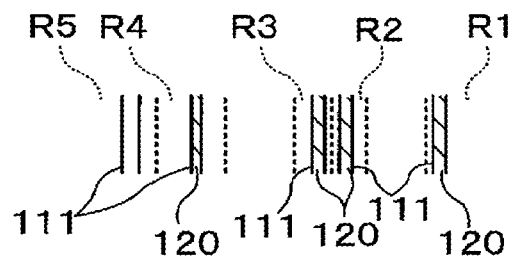
FIG. 9 is an enlarged bottom view showing a state in which the elastic member is disposed on the pressing member shown in FIG. 7.

FIG. 7 is a bottom view of a pressing member 110 of a plasma processing apparatus according to a third embodiment of the present disclosure. FIG. 8 is a plan view of an elastic member 120 to be disposed in the pressing member 110. FIG. 9 is an enlarged bottom view showing a state in which the elastic members 120 are disposed in the pressing member 110. Configurations other than the pressing member 110 and the elastic member 120 are the same as those of the first embodiment. Therefore, description thereof will be omitted.

In the pressing member 60 of the example shown in FIG. 2 and the like, one circular member is composed of the two semicircular plate members 60a and 60b. However, as shown in FIG. 7, the pressing member 110 of the present embodiment is composed of one circular member. In the pressing member 110 of the present embodiment, grooves 111 are respectively formed in annular regions R1 to R5. Each of the grooves 111 has an annular shape in a plan view. Further, in the present embodiment, each of the elastic members 120 is formed into an annular shape as shown in FIG. 8. In addition, as shown in FIG. 9, the elastic members 120 are disposed only in a portion of the plurality of annular regions R1 to R5. More specifically, the elastic members 120 are respectively disposed only in the grooves 111 of the annular regions R1 to R4.

In the plasma processing apparatus including the pressing member 110 and the elastic members 120, when the plasma processing apparatus operates in the aforementioned non-resonance mode, by disposing the elastic members 120 only in the annular regions R1 to R4 as described above, it is possible to reduce the intensity of plasma at the peripheral edge portion of the wafer W, as compared with a case where the elastic members 120 are disposed in all the annular regions R1 to R5. If the elastic members 120 are disposed in all the annular regions R1 to R5, the film thickness at the peripheral edge portion of the wafer W becomes large at the time of performing the plasma process. According to the plasma processing apparatus of the present embodiment in which the elastic members 70 are disposed only in the annular regions R1 to R4, it is possible to make the film thickness uniform in the plane, namely to perform the plasma process uniformly in the plane of the wafer W.

When manufacturing the plasma processing apparatus 1 of the present embodiment, the pressing member 110 having the grooves 111 formed therein is prepared, provisional elastic members 120 are disposed in all the grooves 111, and the plasma processing apparatus 1 for adjusting the disposition conditions of the elastic members 120 is manufactured. Then, based on the result of the plasma process performed by the plasma processing apparatus 1 for adjustment, the disposition conditions of the elastic members 120, i.e., the disposition of the elastic members 120 in any of the annular regions R1 to R5, is adjusted.

In the above embodiment, the elastic member 120 is not provided in one annular region. However, the elastic member 120 may not be provided in a plurality of annular regions. In the above embodiment, the annular region not provided with the elastic member 120 is the outermost region. However, the present disclosure is not limited thereto. For example, the annular region not provided with the elastic member 120 may be the innermost region or may be a region between the outermost region and the innermost region.

Fourth Embodiment

Figure 10:
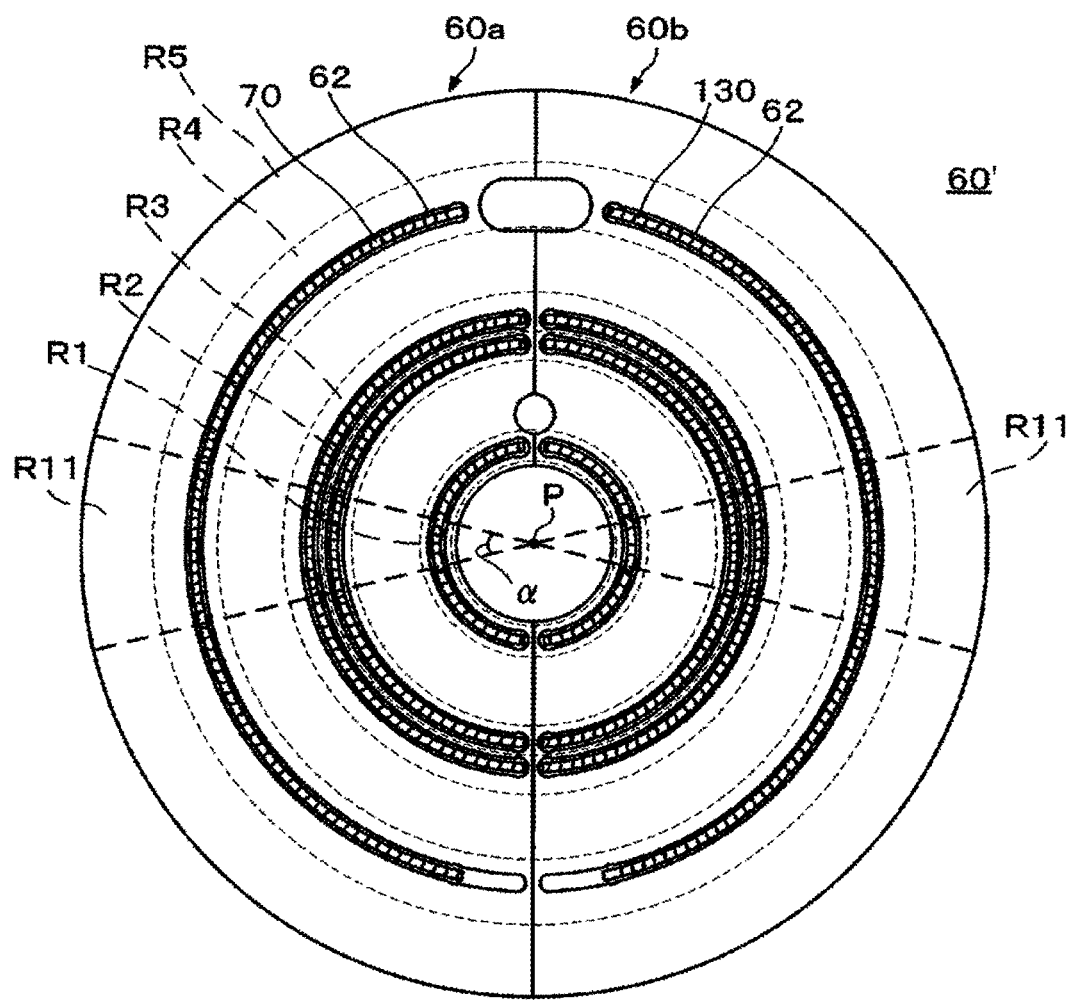
FIG. 10 is a bottom view for explaining an elastic member of a plasma processing apparatus according to a fourth embodiment of the present disclosure.
Figure 11A:
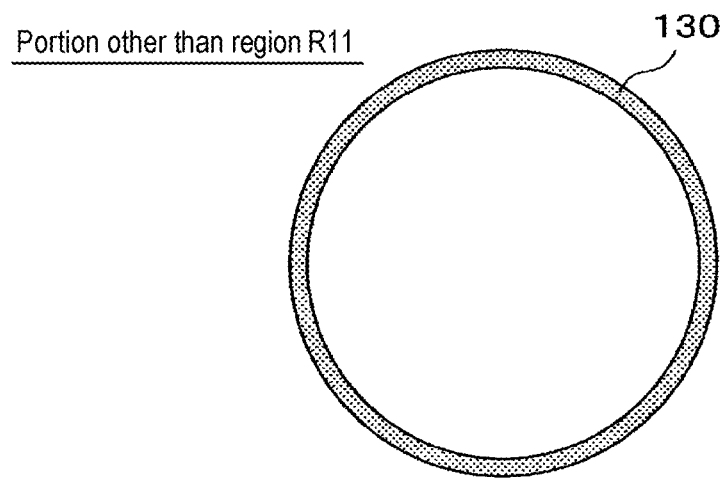
FIGS. 11A and 11B are sectional views of the elastic member shown in FIG. 10.
Figure 11B:
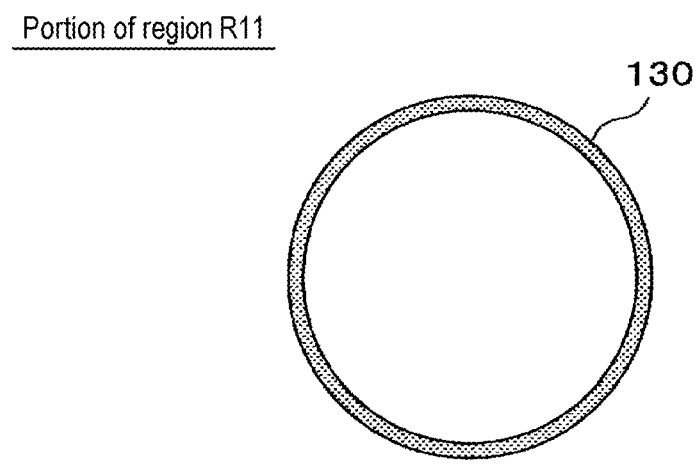

FIG. 10 is a bottom view for explaining elastic members 130 of a plasma processing apparatus according to a fourth embodiment of the present disclosure. FIG. 10 shows a pressing member 60' in which the elastic members 130 are disposed. FIGS. 11A and 11B are sectional views of each elastic member 130. FIG. 11A is a sectional view of a portion of the elastic member 130 located in a region other than the fan-shaped region R11, and FIG. 11B is a sectional view of a portion of the elastic member 130 located in the fan-shaped region R11. Since configurations other than the elastic members 130 are the same as those of the first embodiment, description thereof is omitted.

In the first embodiment, the pressing member 60 is composed of the two semicircular plate members 60a and 60b. The elastic members 70 have a shape of a circular arc which is smaller in the circumferential direction than a semicircular ring in a plan view. The elastic members 70 are respectively disposed only in a portion of each of the plurality of concentric annular regions R1 to R4. The attributes of the elastic members 70, such as the diameter and the like, are uniform along the circumferential direction and are the same between the elastic members 70.

On the other hand, in the present embodiment, the pressing member 60' is similar to the first embodiment, but the elastic members 130 have a semicircular arc shape in a plan view as shown in FIG. 10 and are disposed in the entirety of the region R1 to R4. As shown in FIGS. 11A and 11B, the elastic member 130 is formed so that the diameter of the elastic member 130 located in the fan-shaped region R11 is smaller than the diameter of the elastic member 130 located in the region other than the fan-shaped region R11. As described above, the grooves 62 are formed to have a uniform depth along the circumferential direction, and the depth is the same between the grooves 62.

Therefore, in the plasma processing apparatus of the present embodiment, as in the first embodiment, the pressing force applied to the antenna 40 by the elastic members 130 under the fan-shaped region R11 is small. Therefore, it is possible to uniformly generate plasma on the surface of the wafer W without causing elliptical distortion of plasma which may otherwise be caused due to the structure in which the pressing member 60' is divided into two members at the center thereof. Thus, the plasma process can be performed uniformly in the plane of the wafer W.

The elastic member 130 located in the fan-shaped region R11 is formed to have a smaller diameter in a sectional view than that of the elastic member 130 located in the region other than the fan-shaped region R11. Instead, the elastic member 130 located in the fan-shaped region R11 may be formed of a material having a smaller hardness than the elastic member 130 located in the region other than the fan-shaped region R11. Alternatively, in a case where the elastic member 130 is composed of a spiral spring, the elastic member 130 may be formed so that the number of turns of the elastic member 130 located in a region other than the fan-shaped region R11 is smaller than that of the elastic member 130 located in the fan-shaped region R11.

Fifth Embodiment

Figure 12:
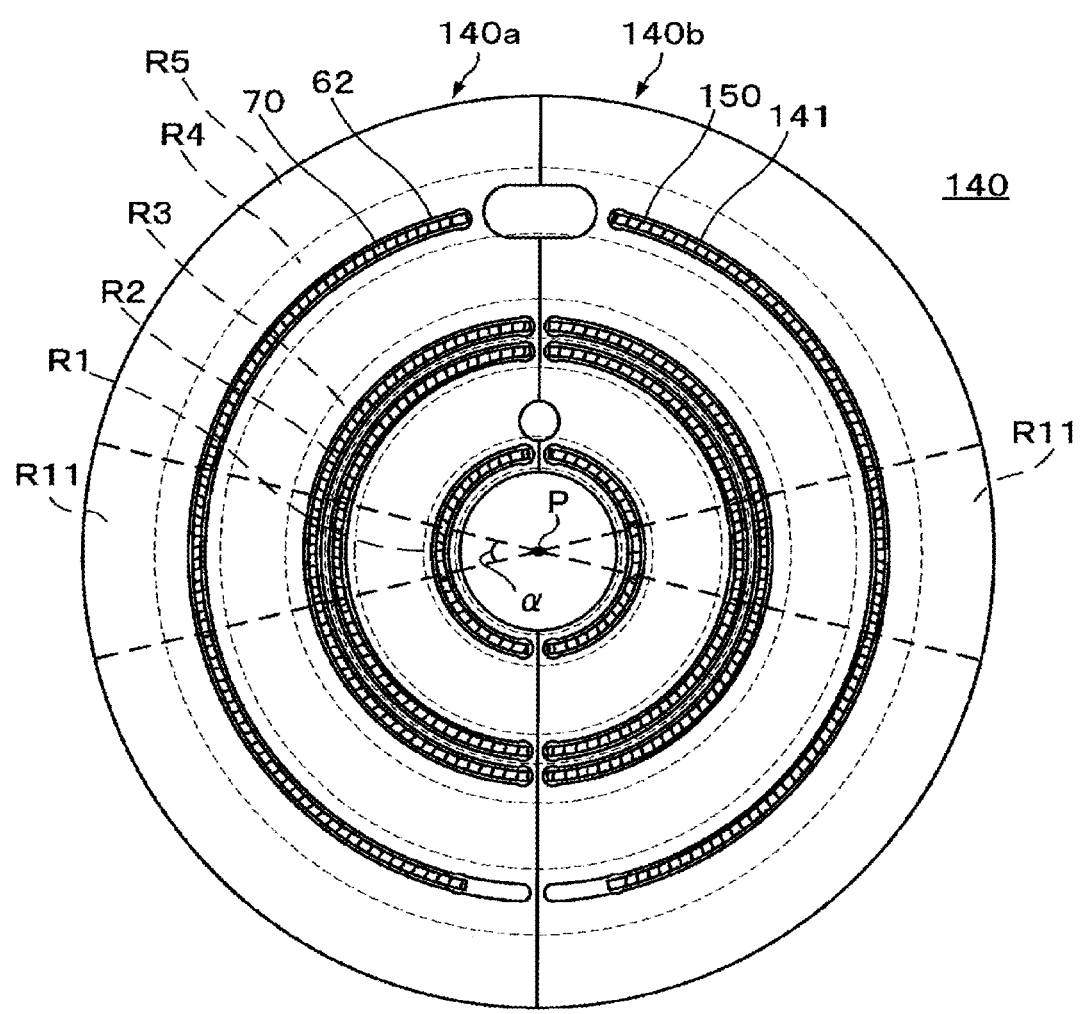
FIG. 12 is a bottom view of a pressing member of a plasma processing apparatus according to a fifth embodiment of the present disclosure.
Figure 13A:
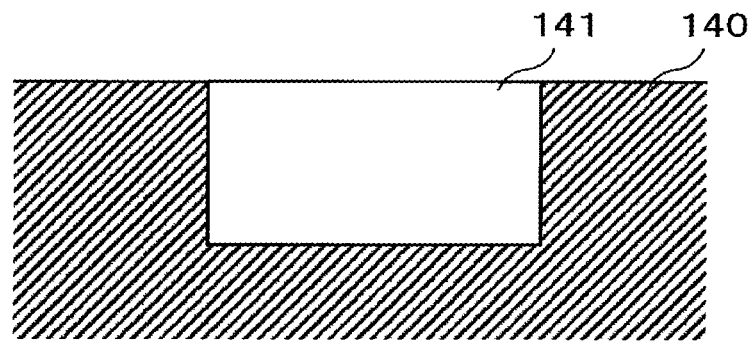
FIGS. 13A and 13B are sectional views of the pressing member shown in FIG. 12.
Figure 13B:
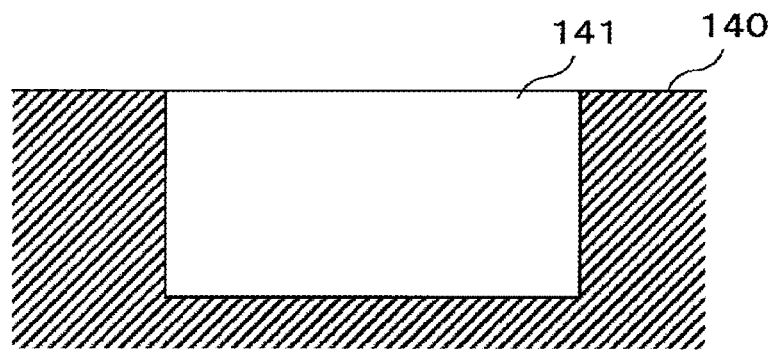

FIG. 12 is a bottom view of a pressing member 140 of a plasma processing apparatus according to a fifth embodiment of the present disclosure. FIGS. 13A and 13B are sectional views of the pressing member 140. FIG. 13A is a sectional view of a portion of the pressing member 140, which is located in a region other than a fan-shaped region R11, and FIG. 13B is a sectional view of a portion of the pressing member 140, which is located in the fan-shaped region R11. Configurations other than the pressing member 140 and elastic members 150 are the same as those of the first embodiment. Thus, description thereof will be omitted.

In the present embodiment, as shown in FIG. 12, just like the fourth embodiment, the pressing member 140 is composed of two semicircular plate members 140a and 140b, each of which has grooves 141 formed therein. The elastic members 150 have a semicircular arc shape in a plan view and are disposed in the entirety of a plurality of concentric annular regions R1 to R4.

As described above, in the fourth embodiment, the grooves 62 are formed to have a uniform depth along the circumferential direction. The depth is the same between the grooves 62. The attributes of the elastic members 130 are different between the portion located in the fan-shaped region R11 and the portion located in a region other than the fan-shaped area R11. On the other hand, in the present embodiment, the attributes of the elastic members 150 are uniform along the circumferential direction and are the same between the elastic members 150. As shown in FIGS. 13A and 13B, the grooves 141 are formed so that the depth of the portion located in the fan-shaped region R11 is smaller than the depth of the portion located in a region other than the fan-shaped region R11.

Therefore, even in the plasma processing apparatus of the present embodiment, just like the first embodiment and the fourth embodiment, the pressing force applied to the antenna 40 by the elastic members 150 under the fan-shaped region R11 is small. Therefore, it is possible to uniformly generate plasma on the surface of the wafer W without causing elliptical distortion of plasma which may otherwise be caused due to the structure in which the pressing member 140 is divided into two members at the center thereof. Thus, the plasma process can be performed uniformly in the plane of the wafer W.

In the illustrated example, the grooves 141 have a rectangular shape in a sectional view. However, the shape of the grooves 141 in a sectional view is not limited thereto. For example, the shape of the grooves 141 may be a semicircular shape having a larger diameter than the elastic members 150, or may be an elliptical shape. By making the shape of the grooves 141 rectangular in a sectional view as described above, a gap between a wall surface forming each of the grooves 141 and each of the elastic members 150 can function as a detour when the elastic members 150 are deformed.

Sixth Embodiment

Figure 14:
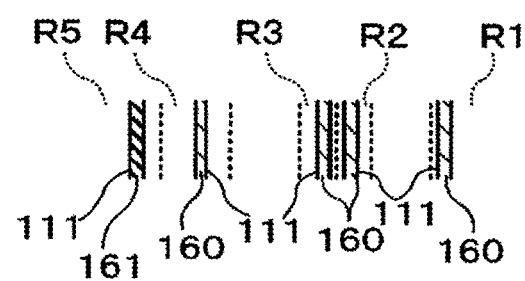
FIG. 14 is an explanatory diagram of an elastic member of a plasma processing apparatus according to a sixth embodiment of the present disclosure.
Figure 15A:
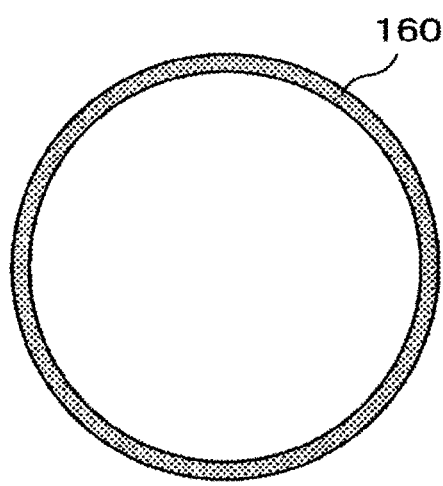
FIGS. 15A and 15B are sectional views of the elastic member shown in FIG. 14.
Figure 15B:
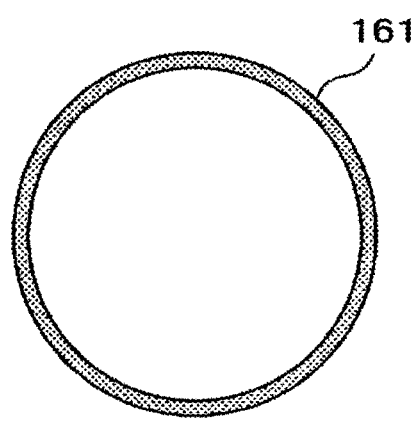

FIG. 14 is an explanatory view of elastic members 160 and 161 of a plasma processing apparatus according to a sixth embodiment of the present disclosure and is an enlarged bottom view showing a state in which the elastic members 160 and 161 are disposed in a pressing member 110. FIGS. 15A and 15B are sectional views of the elastic members 160 and 161. FIG. 15A shows a cross section of the elastic member 160, and FIG. 15B shows a cross section of the elastic member 161. Configurations other than the elastic members 160 and 161 are the same as those of other embodiments. Thus, description thereof is omitted.

The pressing member 110 used in the plasma processing apparatus of the present embodiment is similar to that of the third embodiment shown in FIG. 7 and the like. Grooves 111 having an annular shape in a plan view are formed in the pressing member 110. The grooves 111 are formed at a uniform depth along the circumferential direction. The depth is the same between the grooves 111.

In the third embodiment, the annularly formed elastic members 120 are disposed only in a portion of the plurality of annular regions R1 to R5, i.e., the annular regions R1 to R4. However, in the present embodiment, as shown in FIG. 14, the annularly formed elastic members 160 and 161 are disposed in all the annular regions R1 to R5. In the present embodiment, as shown in FIGS. 15A and 15B, the diameter of the elastic member 161 disposed in the annular region R5 in a sectional view is smaller than that of the elastic members 160 disposed in the annular regions R1 to R4.

Therefore, in the plasma processing apparatus of the present embodiment, when the plasma processing apparatus operates in the aforementioned non-resonance mode, by disposing the elastic member 161 having a small diameter in the annular region R5, it is possible to reduce the intensity of plasma at the peripheral edge portion of the wafer W, as compared with a case where the elastic members 160 having a large diameter are disposed in all the annular regions R1 to R5. If the elastic members 160 having a large diameter are disposed in all the annular regions R1 to R5, the film thickness at the peripheral edge portion of the wafer W becomes large at the time of performing the plasma process. According to the plasma processing apparatus of the present embodiment in which the elastic member 161 having a small diameter is disposed in the annular region R5, it is possible to make the film thickness uniform in the plane, namely to perform the plasma process uniformly in the plane of the wafer W.

The elastic member 161 disposed in the annular region R5 is formed to have a smaller diameter in a sectional view than the elastic members 160 disposed in the annular regions R1 to R4. Instead, the elastic member 161 disposed in the annular region R5 may be formed of a material having a larger hardness than the elastic members 160. Alternatively, the elastic member 161 may be composed of a spiral spring having the number of turns smaller than that of the elastic members 160.

Seventh Embodiment

In the present embodiment, as in the sixth embodiment, the pressing member is composed of a single disk member. Annular grooves are formed in the pressing member. The elastic members have an annular shape and are disposed in the entirety of a plurality of concentric annular regions R1 to R5 (see FIG. 7).

As described above, in the sixth embodiment, the grooves 111 are formed to have a uniform depth along the circumferential direction. The depth is the same between the grooves 111. The attribute of the elastic member 161 disposed in the annular region R5 is different from that of the elastic members 160 disposed in the annular regions R1 to R4. On the other hand, in the present embodiment, the attributes of the elastic members are uniform along the circumferential direction and are the same between the elastic members. The depth of the groove formed in the annular region R5 is larger than the depth of the grooves formed in the annular regions R1 to R4.

Therefore, in the plasma processing apparatus of the present embodiment, when the plasma processing apparatus operates in the aforementioned non-resonance mode, by forming the groove of the annular region R5 to have a small depth, it is possible to increase the intensity of plasma at the peripheral edge portion of the wafer W, as compared with a case where all the grooves of the annular regions R1 to R5 are formed to have a large depth. If all the grooves of the annular regions R1 to R5 are formed to have a large depth, the film thickness at the peripheral edge portion of the wafer W becomes small at the time of performing the plasma process. According to the plasma processing apparatus of the present embodiment in which the groove of the annular region R5 is formed to have a small depth, it is possible to make the film thickness uniform in the plane, namely to perform the plasma process uniformly in the plane of the wafer W.

When manufacturing the plasma processing apparatuses of the fourth to seventh embodiments, a pressing member having provisional grooves formed therein is prepared, provisional elastic members are respectively disposed in all the grooves, and a plasma processing apparatus for adjusting the formation conditions of the grooves and/or the conditions of the attribute of the elastic members is manufactured. Then, based on the result of the plasma process performed by the plasma processing apparatus for adjustment, the formation conditions of the grooves and/or the conditions of the attribute of the elastic members are adjusted.

In the above description of the sixth and seventh embodiments, the grooves and the elastic members are formed so that the intensity of the plasma at the peripheral edge portion of the wafer W is reduced in the plasma processing apparatus operating in the non-resonance mode, namely so that the pressing force applied by the elastic members is made small at the peripheral edge portion of the pressing member. However, the present disclosure is not limited to this embodiment. The grooves and the elastic members may be formed so that the pressing force applied by the elastic members becomes small at the central portion of the pressing member, or may be formed so that the pressing force applied by the elastic members becomes small or large at the intermediate portion between the peripheral edge portion and the central portion of the pressing member. In addition, the grooves and the elastic members may be formed so that the pressing force applied by the elastic members gradually increases or decreases from the center of the pressing member toward the peripheral edge portion thereof.

The present disclosure is useful for a plasma processing apparatus that performs a plasma process on a workpiece such as a semiconductor wafer or the like.

According to the present disclosure in some embodiments, it is possible to perform a plasma process on a workpiece uniformly in the plane of the workpiece.

Although the embodiments of the present disclosure have been described above, the present disclosure is not limited thereto. It will be apparent that those skilled in the art may conceive various changes or modifications within the scope of the technical idea described in the claims. It is to be understood that these changes or modifications belong to the technical scope of the present disclosure.

What is claimed is:

1. A plasma processing apparatus for performing a plasma process on a workpiece inside a processing container by radiating microwaves from an antenna into the processing container through a top plate of the processing container to generate plasma, the apparatus comprising:
    a pressing member having a plurality of grooves formed in a surface facing the top plate of the processing container, and configured to press the antenna against the top plate of the processing container; and
    a plurality of elastic members respectively disposed in the plurality of grooves and deformed while being sandwiched between the pressing member and the antenna, the plurality of elastic members being configured to apply a pressing force to the antenna toward the processing container,
    wherein the plurality of grooves and the plurality of elastic members are respectively provided in a plurality of concentric annular regions each having a center coinciding with a predetermined axis perpendicular to the top plate so as to have a circular arc shape or an annular shape around the predetermined axis, and
    wherein the pressing member is divided into two semicircular members in a plan view, and
    wherein each of the plurality of elastic members is disposed only in a portion of each of the plurality of annular regions except for fan-shaped regions including a center of each of the two semicircular members and an apex of each of the two semicircular members, to compensate for non-uniformity of plasma intensity at the ends of the two semicircular plate members, and
    wherein the center of each of the two semicircular plate members coincides with the center of the plurality of the concentric annular regions.

2. The apparatus of claim 1, wherein each of the plurality of grooves is formed only in a portion of each of the plurality of annular regions except the fan-shaped region.

3. The apparatus of claim 1, wherein each of the plurality of grooves is formed in the entirety of each of the plurality of annular regions.

* * * * *